United States Patent [19]

Mennucci et al.

[11] Patent Number: 5,686,190
[45] Date of Patent: Nov. 11, 1997

[54] MULTILAYER LAMINATE PRODUCT AND PROCESS

[75] Inventors: Joseph P. Mennucci, Manville, R.I.; Charles R. Mead, Newbury, Mass.

[73] Assignee: Brush Wellman Inc., Cleveland, Ohio

[21] Appl. No.: 455,183

[22] Filed: May 31, 1995

Related U.S. Application Data

[63] Continuation of Ser. No. 182,288, Jan. 14, 1994, abandoned.
[51] Int. Cl.$^6$ .................................................. B32B 9/00
[52] U.S. Cl. ........................... 428/472; 428/469; 428/701; 428/702
[58] Field of Search .................................. 428/469, 472, 428/212, 701, 702

[56] References Cited

U.S. PATENT DOCUMENTS

| | | |
|---|---|---|
| 3,744,120 | 7/1973 | Burgess . |
| 3,766,634 | 10/1973 | Babcock . |
| 3,854,892 | 12/1974 | Burgess . |
| 3,911,553 | 10/1975 | Burgess . |
| 3,993,411 | 11/1976 | Babcock et al. ............ 403/277 |
| 3,994,430 | 11/1976 | Cusano . |
| 4,129,243 | 12/1978 | Cusano . |
| 4,409,278 | 10/1983 | Jochym . |
| 4,413,766 | 11/1983 | Webster . |
| 4,420,509 | 12/1983 | Barrell . |
| 4,483,810 | 11/1984 | Bunk . |
| 4,500,029 | 2/1985 | Yerman . |
| 4,506,108 | 3/1985 | Kersch et al. ............ 174/52 FT |
| 4,538,170 | 8/1985 | Yerman . |
| 4,640,723 | 2/1987 | Sugai . |
| 4,646,129 | 2/1987 | Yerman . |
| 4,649,083 | 3/1987 | Fister et al. ............... 428/469 |
| 4,809,135 | 2/1989 | Yerman . |
| 4,811,893 | 3/1989 | Kanahara . |
| 4,860,939 | 8/1989 | Guinet . |
| 4,869,758 | 9/1989 | Wantanabe . |
| 4,987,677 | 1/1991 | Tanaka . |
| 4,990,720 | 2/1991 | Kaufman . |
| 4,996,116 | 2/1991 | Webster . |
| 5,097,385 | 3/1992 | Chu . |
| 5,168,348 | 12/1992 | Chu . |
| 5,269,372 | 12/1993 | Chu . |
| 5,303,555 | 4/1994 | Chrysler . |
| 5,304,846 | 4/1994 | Azar . |
| 5,370,178 | 12/1994 | Agonafer . |
| 5,394,299 | 2/1995 | Chu . |

FOREIGN PATENT DOCUMENTS

| | | |
|---|---|---|
| 0097944 A2 | 1/1984 | European Pat. Off. . |
| 3633907A1 | 10/1986 | Germany . |
| 3633907C1 | 6/1989 | Germany . |
| 63-89477 | 4/1988 | Japan . |

OTHER PUBLICATIONS

Karavolis, Michael, Dec. 1993, "Production of Precision Clad 'Self Brazing' Materials to Achieve High Yields and Strong Joints".

Mahaney, H.V., and Vader, D.T., "Predicted and Measured Performance of an Advanced Laminated Heat Sink for Multi–Chip Modules", Nov. 28–Dec. 3, 1993.

*Primary Examiner*—Archene Turner
*Attorney, Agent, or Firm*—Hopgood, Calimafde

[57] ABSTRACT

A controlled oxygen content copper clad laminate product and process. In accordance with one aspect of the present invention, there is provided a laminate having a first layer of oxygen-free copper joined to a second layer of oxygen-rich copper by the steps of (i) cladding the first layer to the second layer at a relatively low speed to minimize rolling friction, (ii) finish rolling the laminate to substantially increase its thickness tolerance, (iii) slitting the laminate to increase its width tolerance, (iv) profiling a groove at a selected location in the laminate, (v) finish slitting a plurality of ribbons from the laminate, (vi) tension leveling the laminate to straighten and flatten its shape, (vii) stamping the laminate into sections each of a selected configuration, (viii) cleaning laminate surfaces, and (ix) direct bonding the laminate to a substrate material such that the first layer is annealed to the second.

2 Claims, 5 Drawing Sheets

MULTILAYER LAMINATE PRODUCT AND PROCESS

This is a continuation of application Ser. No. 08/182,288 filed Jan. 14, 1994 now abandoned.

FIELD OF THE INVENTION

The present invention relates to processes for joining materials to one another and more particularly to the production of a multilayer laminate for energy transfer applications.

BACKGROUND OF THE INVENTION

Materials having relatively high thermal and electrical conductivities have been found desirable for use in microelectronic packaging. Pure Copper, for instance, has been found particularly suitable both as an efficient conductor of electricity and because of its ability to rapidly conduct and dissipate heat.

For this reason, copper sheeting is often used as part of a microchip heat sink/isolator. Typically, the sheeting is bonded to a ceramic substrate by a process known as direct bonding. This process is notable for its products which have a relatively high thermal dissipation capability, strength, reliability, and small size. Direct bonding is also known for its relatively low cost. An intermediate bonding layer is sometimes used to modify the properties of the sheeting material, e.g., to strengthen the material or control its coefficient of thermal expansion.

Direct bonding requires that the bonding surface of the copper be oxidized so that covalent bonds can be formed with the ceramic during the thermal bonding cycle. Typically, both sides of the copper strip are coated with (or dipped in) a chemical solution that promotes oxidation. This forms a low melting temperature eutectic of copper oxide on each side of the strip which bonds to a ceramic substrate upon heating.

While one oxidized side of the strip is joined to the substrate during direct bonding, the other oxidized side bonds undesirably to the carrier or fixture upon which it rests. Also, the resulting bond has been found of limited integrity, dimensional stability, durability and reliability. Chemical coating has additionally been found costly and produces excessive chemical waste.

SUMMARY OF THE INVENTION

In accordance with one aspect of the present invention, there is provided a controlled oxygen content copper clad laminate and process. The laminate comprises a first layer of oxygen-free copper joined to a second layer of oxygen-rich copper by the steps of (i) cladding the first layer to the second layer at a relatively low speed to minimize rolling friction, (ii) finish rolling the laminate to substantially increase its thickness tolerance, (iii) slitting the laminate to increase its width tolerance, (iv) profiling a groove at a selected location in the laminate, (v) finish slitting a plurality of ribbons from the laminate, (vi) tension leveling the laminate to straighten and flatten its shape, (vii) stamping the laminate into sections each of a selected configuration, (viii) cleaning laminate surfaces, and (ix) direct bonding the laminate to a substrate material such that the first layer is annealed to the second.

Although the present invention is shown and described in connection with oxygen-free and oxygen-rich copper, it may be adapted for bonding other materials such as those containing precious metals, aluminum, titanium, nickel, steel, and their alloys as well as carbon and ceramics.

Accordingly, it is an object of the present invention to provide a laminate with enhanced heat transfer properties for use in high performance heat sinks.

Another object of the present invention is to provide for the simple and efficient manufacture of heat sinks with minimum manual labor requirements.

Still another object of the present invention is to maximize the energy transfer properties of materials comprising a multilayer laminate.

Yet another object of the present invention is to facilitate low cost production of high performance heat sink structures having acceptable acoustics, cooling rates and pressure drop.

A further object of the present invention is to facilitate rapid dissipation of heat from microelectronic packaging.

Another object of the present invention is to isolate microelectronic modules thermally and electrically from one another.

Still a further object of the present invention is to substantially reduce chemical waste during metal bonding.

The present invention will now be further described by reference to the following drawings which are not intended to limit the accompanying claims.

BRIEF DESCRIPTION OF THE DRAWINGS

The same numerals are used throughout the figure drawings to designate similar elements. Still other objects and advantages of the present invention will become apparent from the following description of the preferred embodiments.

DETAILED DESCRIPTION OF THE PREFERRED EMBODIMENTS

Microelectronic packaging such as multi-chip modules (MCMs) have been found advantageous for providing relatively high power with reduced interconnection signal delay and packaging volume, as compared to conventional single-chip modules. Given their substantial heat fluxes, stacked or laminated heat sinks with parallel channels have been found necessary to obtain heat sink dimensions suitable for effective dissipation of heat.

Figure 4:
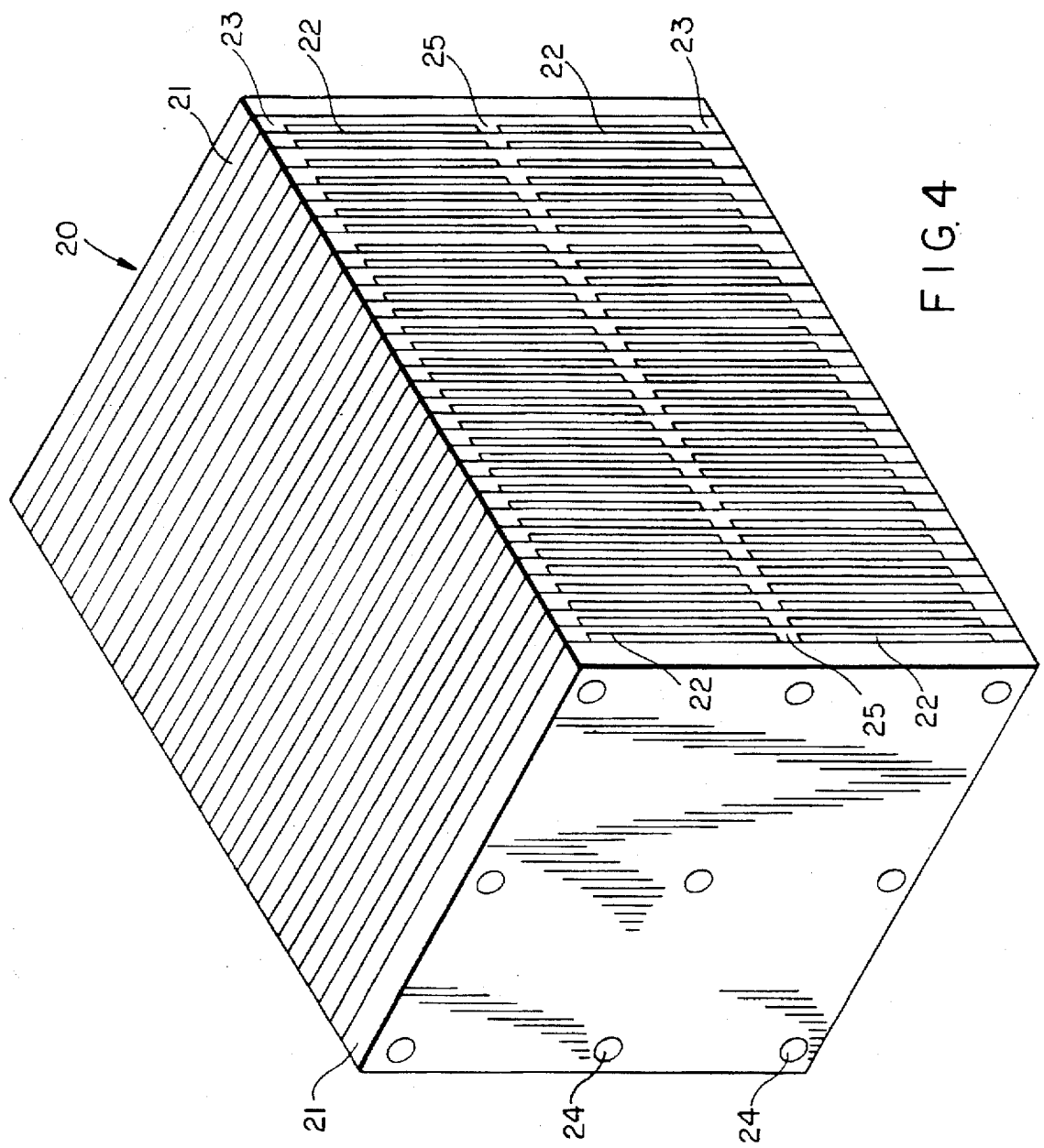
FIG. 4 is a perspective view of a heat sink/isolator in accordance with one aspect of the present invention.

Laminated heat sinks typically have a base with an array of stacked, plate-like fins. Each fin is configured such that a channel is formed between each fin pair. Heat is first conducted from the base to the fins, and then dissipated from the fins by thermal transfer to a coolant such as air passing through the channels. A heat sink of this general configuration is shown in FIG. 4.

Increased device and module powers require high performance, fluid-cooled heat sinks. While increased heat dissipation from the fins is generally achieved by increasing the coolant flow rate, the flow rate necessary for optimal cooling has lead to undesirable flow-induced vibrations, pressure drop, and acoustics which may effect the sensitive microelectronics nearby.

To form a laminated heat sink, typically a plurality of copper plates, each having a wide shallow open channel across one face, are joined front-to-back. In the laminate, the channels become an array of closed parallel cooling channels. By adjusting plate thickness, as well as the width and depth of the open channel across the face of the plates, heat sink dimensions and, hence, heat fluxes are controlled.

In other environments, heat sinks are used to isolate microchips both thermally and electrically from one another. For example, a microchip is soldered to a heat sink in the form of a planar, multilayer laminate which, in turn, is mounted to a microelectronics module. An objective is to prevent differing levels of heat and electrical energy generated by each microchip from interfering with the operation of other chips of the module.

The foregoing description is provided for purposes of illustration and not to limit the intended environment or application of the present invention. The remaining structural and functional aspects of microelectronic packaging are known by those skilled in the art and further description is believed unnecessary for illustration of the present invention.

In accordance with one aspect of the present invention, there is provided a controlled oxygen content copper clad laminate and process. The laminate comprises a first layer of oxygen-free copper joined to a second layer of oxygen-rich copper by the steps of (i) cladding the first layer to the second layer at a relatively low speed to minimize rolling friction, (ii) finish rolling the laminate to substantially increase its thickness tolerance, (iii) slitting the laminate to increase its width tolerance, (iv) profiling a groove in the laminate at a selected location, (v) finish slitting a plurality of ribbons from the laminate, (vi) tension leveling the laminate to straighten and flatten its shape, (vii) stamping the laminate into sections each of a selected configuration, (viii) cleaning laminate surfaces, and (ix) direct bonding the laminate to a substrate material such that the first layer is annealed to the second.

Initially, certified oxygen-free copper strip, e.g., OFHC copper 99.99% Cu (Mill Standard C-101), is processed in coil form from a selected starting size, e.g., of about 0.060 in.×2.500 in. (annealed temper). The strip is cold rolled using a calculated pass schedule, e.g., from about 0.060 in. (spring temper UTS 50 KSI minimum) to 0.025 in. and from about 2.500 in. to 2.130 in. Preferably, size reduction is limited to about 20% for a single pass to prevent excessive temperatures, e.g., 200° F., which could effect the grain structure of the copper. The resulting grain structure has been found relatively important both functionally and cosmetically to the grain size of the final laminate product.

Figure 3:
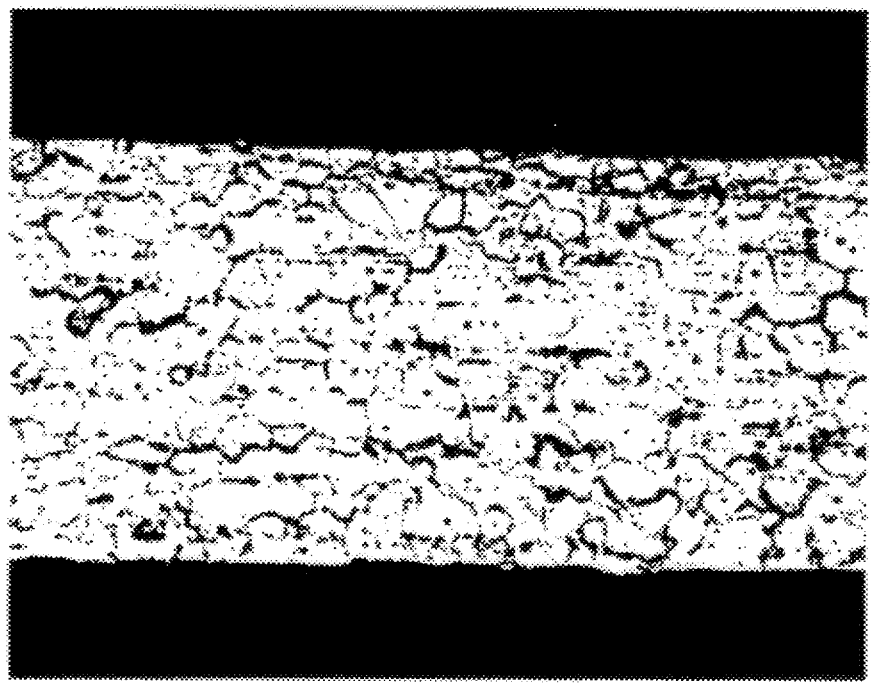
FIG. 3 is a micrograph of oxygen-rich copper strip at 120× magnification containing 380 ppm oxygen, in accordance with another aspect of the present invention.

An oxygen-rich copper strip, e.g., electrolytic tough pitch (ETP) copper 99.90% Cu (Mill Standard C-110), is also processed from a selected starting size, e.g., of about 0.125 in.×2.500 in. (annealed temper). The strip is cold rolled, for example, from about 0.060 in. (extra spring temper UTS 58 KSI minimum) to 0.025 in. and from about 2.500 in. to 2.130 in. The oxygen content of Mill Standard C-110 is generally within a range of 10 ppm to 2000 ppm. For the most consistent results in bond uniformity and strength, it is preferred that the oxygen content be controlled to remain within a selected envelope, e.g., generally within a range of 300 ppm to 500 ppm oxygen. In one embodiment of the present invention, the concentration of oxygen is about 380 ppm, as shown in FIG. 3. Oxygen appears as heavy black spots at the grain boundaries.

Next, the surfaces of the oxygen-free copper strip and the oxygen-rich copper strip are cleaned for bonding. This is done by passing the strips through an aqueous-ultrasonic degreasing machine to remove organic materials (e.g., oil and dirt) and then under a rotating soft abrasive wheel (brush) flushed continuously with water (wet brush). This removes surface oxides of the copper and roughens its surface to enhance cladability.

The oxygen-free copper strip is then placed atop and joined to the strip of oxygen-rich copper by cladding, e.g., mechanically crushing the strips together in a 4-hi rolling mill. The resulting thickness reduction and rolling friction typically produce heat. Again, since excessive heat could effect grain structure, it is preferred that the strip be simultaneously air quenched at the exit end of the rolling mill. In addition, relatively low process speeds, e.g., less than or equal to about 12 ft./min., are used to prevent heat build-up. Alternatively or concurrently therewith, the percent (%) reduction during cold roll bonding is also limited, e.g., to about 76%.

The first layer preferably comprises copper sheeting having an oxygen content generally within a range of 95 ppm to 2000 ppm. As the oxygen content decreases, bond strength increases, a maximum strength being at about 95 ppm. It is also preferred that the second layer comprise oxygen-free copper sheeting, i.e., copper containing a maximum of about 10 ppm oxygen.

During the next step, the laminate is finish rolled to substantially increase its thickness tolerance. Finish rolling is also done on a 4-hi rolling mill. This step improves substantially the thickness tolerance of the laminate, e.g., from about ±0.001 in. to 0.0003 in. When highly polished rolls are used, surface finish is also improved.

The laminate is then slit to increase its width tolerance. During slitting, the laminate is passed between two rotating arbors carrying rotating cutting blades. This removes the edges of the laminate, thereby trimming its width. Alternatively or concurrently therewith, a pre-slitting step is performed prior to slitting. Pre-slitting removes rough edges and improves width tolerance of the laminate, e.g., from about 0.015 in. to 0.001 in. Improved width tolerance has been found relatively important for guiding the strip smoothly and precisely during profiling.

Upon the fourth step, at least one groove is profiled at a selected location in the laminate to provide a flow channel. As coolant (liquid or gas) flows through the channel, heat removal is effected. Hence, in accordance with one aspect of the present invention, the groove acts as a heat exchanger. Alternatively or concurrently therewith, the groove serves as a reservoir for capturing excess solder during assembly by the end user.

Profiling may be done by form rolling, skiving, or milling. During skiving, for instance, the material is passed under a stationary cutting blade known as a skiving tool. This changes the laminate thickness in selected areas across the strip width. Alternatively, the laminate is form rolled, i.e., passed under a roll with a continuous protuberance having the dimensions of the groove.

During the fifth step, a plurality of ribbons are finish slit from the laminate. Finish slitting is done preferably using a technique like that described in step three, but to cut individual ribbons from a wider processing width and yield a multiple of strands.

Figure 1:
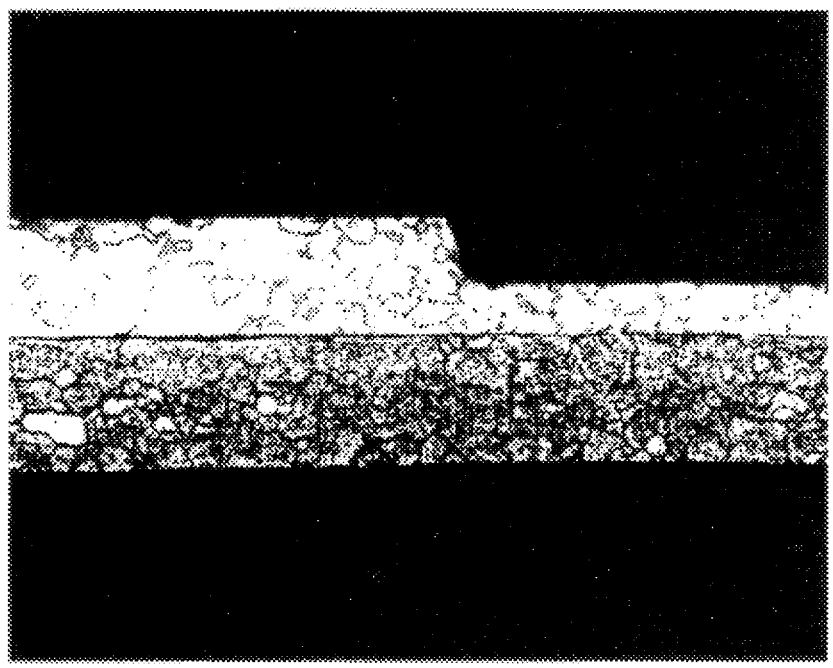
FIG. 1 is a micrograph of a controlled oxygen content copper clad laminate at 120× magnification, in accordance with one aspect of the present invention.

Thereafter, the laminate is tension leveled to straighten and flatten its shape. Tension leveling is done, for example, by placing the laminate in tension, that is, passing it through a series of deflection rolls, e.g., nine, each of a relatively small diameter, e.g., about 0.375 in. At this stage, the grain structures of both the layers of oxygen-free copper and oxygen-rich copper are substantially unaffected, as shown in FIG. 1.

This step enhances strip quality by improving straightness, flatness, and shape of the strip with minimal variation. By insuring intimate contact between the laminate and ceramic substrate, void-free bonds are formed. Void-free bonds are relatively important for effective direct bonding.

Subsequently, the strip is stamped into discrete pieces, cleaned (degreased) to eliminate oils and other materials which may interfere with direct bonding, and bonded to a ceramic substrate by direct bonding. Cleaning is done preferably by abrasive polishing and/or chemically etching the pieces. For instance, the stamped pieces are placed in a vibratory bowl with abrasive ceramic media, e.g., XC3-8T angle cut triangles. Next, the pieces are removed and chemically etched, e.g., using a series of acid baths—the first bath being a hydrocholoric or sulfuric acid solution, e.g., Branson MC-2, followed by a bath of ammonium persulfate, and a citric acid bath.

Figure 2:
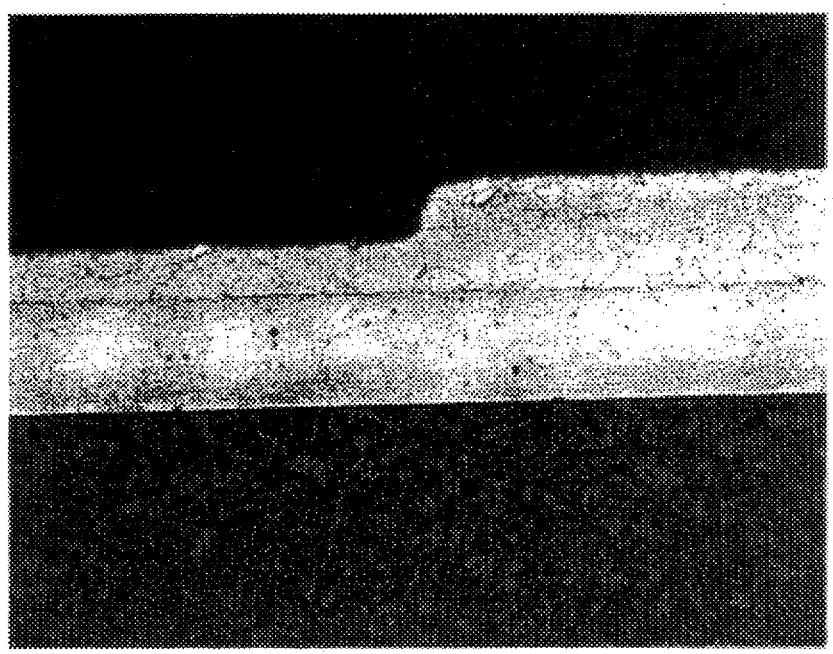
FIG. 2 is a micrograph of the laminate of FIG. 1 direct bonded to a beryllium oxide substrate.

During direct bonding, temperature and other conditions simultaneously anneal the laminate, metallurgically bonding the first layer to the second. After direct bonding, a fine grain structure is produced in both copper layers (See FIG. 2). Various methods of direct bonding metals to ceramics are described, for example, in U.S. Pat. No. 3,944,430, which issued on Nov. 30, 1976, and in U.S. Pat. No. 4,129,243, which issued on Dec. 12, 1978, the disclosures of which are hereby incorporated by reference.

Prior to direct bonding, layers were joined mechanically by cladding. This produces a "green bond" which has generally been found of marginal integrity. Strengthening is typically done metallurgically by continuous strip annealing prior to direct bonding. The present process is advantageous in that annealing is done during rather than prior to direct bonding so that the effects of cold working are maintained, i.e., it facilitates production of an ultra-fine grain size in the layers during direct bonding. Because one side of the laminate remains oxygen-free, no bonding occurs between the laminate and the setter plate, fixture or other carrier. The oxygen-free side can then sit on the setter plate during subsequent firing of direct bond copper components.

Also, oxygen impregnated copper provides oxygen to the copper-ceramic interface more uniformly than does chemically coated copper. This improves substantially bond integrity and part reliability. Moreover, it eliminates the three chemical baths required to chemically coat copper, significantly reducing costs, chemical waste, and the health risks associated with hauling the waste. Dimensional stability and durability of oxygen impregnated copper is also superior.

Yet another advantage is the decreased grain growth accomplished by the present invention. This results in a substantially smoother, void-free surface finish, as compared to chemically oxidized copper or straight ETP. It also prevents build-up of eutectic oxide on the post-fired surface, eliminating the need for chemical stripping of the copper surface before solder application.

In accordance with one embodiment, the stamped pieces of laminate are stacked one on top of the other such that, during direct bonding (annealing), diffusion bonding occurs between the internal metal to metal interfaces of the clad layers. Simultaneously, there is diffusion bonding at the metal to metal interfaces between adjacent sides of the stacked laminate pieces. This substantially eliminates voids between the interfaces. The result is a void-free, multiple-layer copper clad laminate with maximum heat transfer capability.

Overall, this lamination technique advantageously permits cost-effective mass production of high performance heat sink structures, significantly extending cooling and isolation characteristics for microelectronic applications.

Although the embodiments illustrated herein have been described for use with copper or a copper alloy, it is understood that an analogous process could be practiced on other materials, giving consideration to the purpose for which the present invention is intended. For example, similar processing of materials containing precious metals and their alloys, aluminum, titanium, nickel, steel, carbon and ceramics is considered within the spirit scope of the present invention. It is also foreseeable that an intermediate bonding layer such as nickel, titanium or silver could be added between the copper layers to modify properties of the laminate materials.

Figure 8:
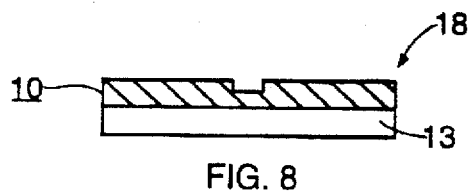
FIG. 8 is a sectional view taken along lines 8—8 of FIG. 7.
Figure 9:
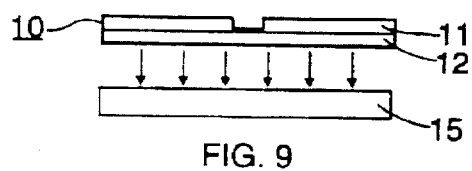
FIG. 9 is a representation of the laminate and substrate of FIG. 8 prior to direct bonding.
Figure 10:
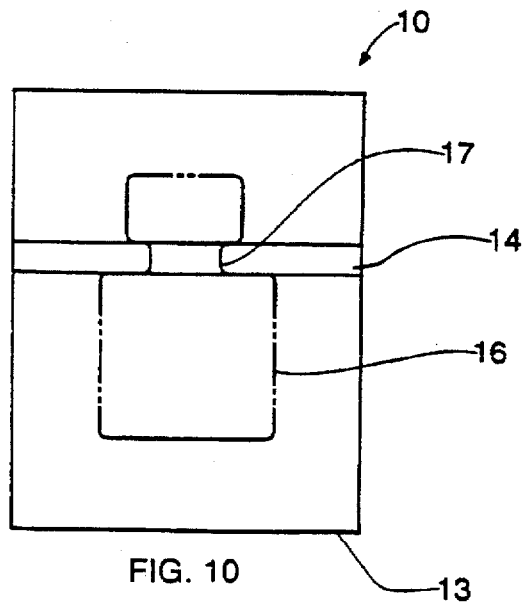
FIG. 10 is a plan view of a piece cut from the strip of FIG. 7.

By the forgoing process, a laminate 10 (or preform) is produced which comprises a layer 11 of oxygen-free copper (C11000) clad to a layer 12 of oxygen-rich copper (C10100), as shown in FIGS. 8 and 9. In accordance with one aspect of the present invention, the laminate is a strip 13 about 0.010 in. thick and about 0.500 in. wide. As shown in FIGS. 7–10, a channel 14 is profiled in the strip about 0.003 in. deep ±0.0006 in. and about 0.036 in. wide which runs generally along the center of the strip, about 0.210 in. from one side of the strip and about 0.174 in. from the other side.

During direct bonding, the laminate is bonded to a ceramic substrate 15 such as beryllium oxide so as to produce a laminate product 18. In one embodiment, a "dog bone"-like shape 16 is formed in the laminate such as by etching or stamping. Neck 17 of the "dog bone" extends about 0.0180 in. from each side of the channel center line, and begins about 0.040 in. from the strip center line.

This product has been found effective as a heat sink/isolator for microelectronic modules. For instance, the % strength reduction of this BeO-DBCu metallized substrate at relatively high temperatures has been found substantially higher than that of Brush Wellman Mo—Mn or DUPONT 0022.

The present invention is also beneficial in permitting the use of pure copper which has a substantially higher thermal conductivity than that of Cu thick film, Mo—Mn thick film or As—Pd thick film and a substantially lower resistivity. The use of DBCu, it is noted, provides electrical conductivity within about 5% of that of pure copper.

The BeO substrate has similar benefits in having a thermal conductivity substantially higher than that of AlN. Together, the copper laminate and BeO substrate provide superior thermal resistance performance over AlN-Cu or Al2O3-Cu. A substantially higher maximum conductor current is also provided without the need for an intermediate bonding layer.

Figure 5:
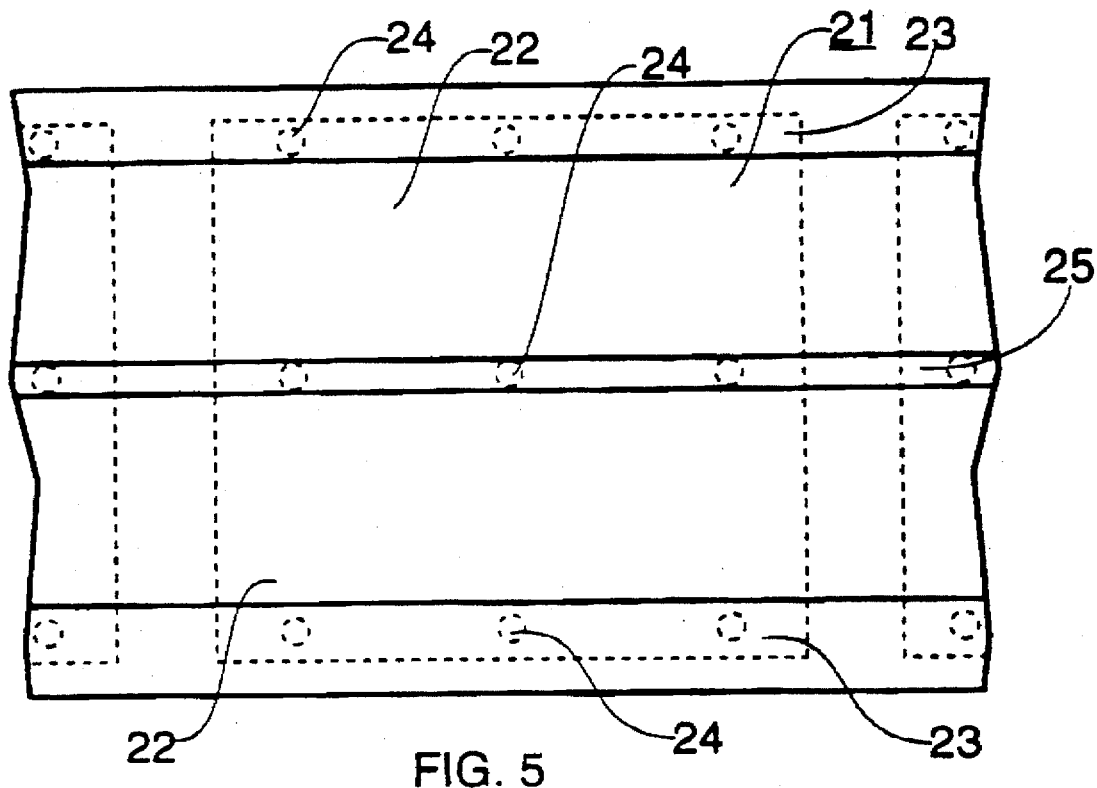
FIG. 5 is a plan view of a copper clad laminate strip. Shown in dashed lines is a fin stamped from the strip of FIG. 4.
Figure 6:
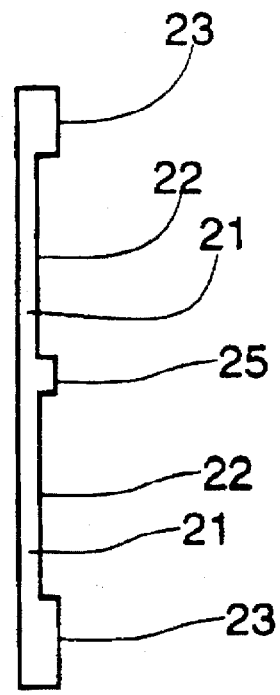
FIG. 6 is a side view of the fin of FIG. 5.
Figure 7:
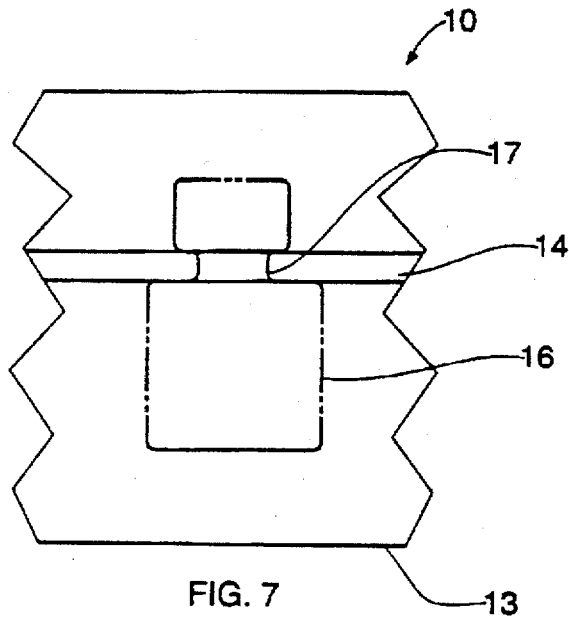
FIG. 7 is a plan view of a copper clad laminate strip in accordance with another aspect of the present invention.

In accordance with another aspect of the present invention, each DBCu product is used as a fin 21 of a multilayer heat sink 20, as shown in FIG. 4. Each fin is stamped from multi-gauge DBCu strip having a channel 22, e.g., about 103 mm wide, generally along its center such that spacers 23 are left on opposing sides of the fin, as best seen in FIGS. 5 and 6. Each fin has selected dimensions, e.g., about 115 mm wide and about 1.5 mm thick.

The fins are stacked upon one another so as to form a block and joined (or fixtured) together by conventional thru rivets 24. The rivets preferably comprise a material substantially the same as that of the fins. In the present embodiment, the rivets substantially comprise oxygen-rich copper (C110) and have selected diameters, e.g., each generally within a range of 0.003 in. to 0.006 in. It is understood that the necessary dimensions and configuration of the rivets depends upon block size and other structural requirements, as will be understood by those skilled in the art.

At least one stiffener rib 25 is positioned along the center of channel for added reinforcement. The stiffener rib divides the channel into two equal portions, each about 50 mm wide.

During direct bonding, there is interdiffusion (diffusion bonding) not only at metal to metal interfaces between the fins, but also between the rivets and the fins. This results in the formation of a solidified heat sink structure.

By the present invention, the energy transfer capability of heat sink structures is maximized while maintaining acceptable acoustics, cooling rates and pressure drop for the sensitive microelectronics nearby, and a low cost.

Various modifications and alterations to the present invention may be appreciated based on a review of this disclosure. These changes and additions are intended to be within the scope and spirit of this invention as defined by the following claims.

What is claimed is:

1. A laminate product for energy transfer applications which comprises a first layer of oxygen-free copper clad to a second layer of oxygen-rich copper, and a ceramic substrate direct bonded to the second layer, the oxygen-free copper including up to about 10 ppm oxygen and the oxygen content of the oxygen-rich copper being generally within a range of 95 and 2000 ppm.

2. The product set forth in claim 1 wherein the ceramic substrate comprises beryllium oxide.

* * * * *